United States Patent
Zhang et al.

(10) Patent No.: US 9,881,556 B2
(45) Date of Patent: Jan. 30, 2018

(54) SHIFT REGISTER CIRCUIT, ITS DRIVING METHOD, ARRAY SUBSTRATE AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Yong Zhang, Beijing (CN); Shijun Wang, Beijing (CN); Yanna Xue, Beijing (CN); Yue Li, Beijing (CN); Wenbo Jiang, Beijing (CN); Wenjun Xiao, Beijing (CN); Zhiying Bao, Beijing (CN); Zhenhua Lv, Beijing (CN)

(73) Assignees: BOE TECHNOLOGY GROUP CO., LTD. (CN); BEIJING BOE OPTOELECTRONICS TECHNOLOGY CO., LTD. (CN)

( * ) Notice: Subject to any disclaimer, the term of this patent is extended or adjusted under 35 U.S.C. 154(b) by 1 day.

(21) Appl. No.: 15/233,983

(22) Filed: Aug. 11, 2016

(65) Prior Publication Data
US 2017/0193907 A1 Jul. 6, 2017

(30) Foreign Application Priority Data
Jan. 5, 2016 (CN) .......................... 2016 1 0005352

(51) Int. Cl.
*G09G 3/3258* (2016.01)
*G09G 3/3266* (2016.01)
*G11C 19/28* (2006.01)

(52) U.S. Cl.
CPC ......... *G09G 3/3258* (2013.01); *G09G 3/3266* (2013.01); *G11C 19/28* (2013.01);
(Continued)

(58) Field of Classification Search
CPC ............... G09G 3/3258; G09G 3/3266; G09G 2310/08; G09G 2310/0251;
(Continued)

(56) References Cited

U.S. PATENT DOCUMENTS

2006/0001637 A1* 1/2006 Pak ....................... G09G 3/3677
345/100
2008/0013670 A1* 1/2008 Lo ........................... G11C 19/28
377/79

(Continued)

*Primary Examiner* — Ryan A Lubit
(74) *Attorney, Agent, or Firm* — Brooks Kushman P.C.

(57) ABSTRACT

The present disclosure provides a shift register circuit, which includes a first switch unit connecting an input end to a first node when a positive-phase clock signal is at a first level; a second switch unit applying a negative-phase clock signal to an output end when the first node is at the first level; a positive feedback unit enabling the second node to be at a second level when the first node is at the first level and enabling the first node to be at the second level when the second node is at the first level; a third switch unit enabling a third node to be at the first level when the positive-phase clock signal is at the first level; a fourth switch unit connecting the second node to the third node when the negative-phase clock signal is at the first level; and a fifth switch unit.

20 Claims, 4 Drawing Sheets

(52) U.S. Cl.
CPC ............... *G09G 2300/0426* (2013.01); *G09G 2310/0251* (2013.01); *G09G 2310/0286* (2013.01); *G09G 2310/08* (2013.01); *G09G 2320/0252* (2013.01); *G09G 2330/021* (2013.01)

(58) Field of Classification Search
CPC ..... G09G 2310/0286; G09G 2330/021; G09G 2320/0252; G09G 2300/0426; G11C 19/28
See application file for complete search history.

(56) References Cited

U.S. PATENT DOCUMENTS

| | | | | |
|---|---|---|---|---|
| 2008/0152072 | A1* | 6/2008 | Herrmann .............. | G11C 19/28 377/74 |
| 2008/0226013 | A1* | 9/2008 | Deane ................... | G11C 19/00 377/70 |
| 2009/0128476 | A1* | 5/2009 | Lee ...................... | G09G 3/3677 345/98 |
| 2014/0079173 | A1* | 3/2014 | Yan ....................... | G11C 19/28 377/64 |
| 2014/0079175 | A1* | 3/2014 | Wu ....................... | G11C 19/28 377/72 |
| 2017/0069265 | A1* | 3/2017 | Zhou .................... | G09G 3/3233 |
| 2017/0162110 | A1* | 6/2017 | Kishikawa ........... | G09G 3/3233 |

\* cited by examiner

US 9,881,556 B2

SHIFT REGISTER CIRCUIT, ITS DRIVING METHOD, ARRAY SUBSTRATE AND DISPLAY DEVICE

CROSS-REFERENCE TO RELATED APPLICATIONS

This application claims priority to Chinese application No. 201610005352.5, filed Jan. 5, 2016, which is hereby incorporated by reference in its entirety.

TECHNICAL FIELD

The present disclosure relates to the field of electronic technology, in particular to a shift register circuit, its driving method, an array substrate and a display device.

BACKGROUND

Along with the increase in the resolution of mobile phones, Pixels Per Inch (PPI) becomes increasingly higher, and amorphous-Silicon (a-Si) products cannot meet the requirements of high PPI. Currently, Low Temperature Poly-Silicon (LTPS) Thin Film Transistor (TFT) display devices and Active Matrix-Organic Light-Emitting Diode (AMO-LED) display devices have been presented so as to further increase the PPI. For the sake of economy, in the LTPS TFT or AMOLED display device, it is necessary to replace a circuit externally bound to an array substrate with a shift register circuit formed on the array substrate. However, in the related art, usually a potential change at an output end of the shift register circuit is used as a feedback to trigger a pull-up or pull-down action. Due to the delay caused by the display device and the circuit itself, the response time for the conversion between high and low levels of a scanning driving signal may increase, and as a result, a response speed of the entire shift register circuit will be adversely affected.

SUMMARY

An object of the present disclosure is to provide a shift register circuit, its driving method, an array substrate and a display device, so as to prevent a response speed of the shift register circuit from being adversely affected due to the use of a signal at an output end as a feedback to trigger a pull-up or pull-down action.

In one aspect, the present disclosure provides in some embodiments a shift register circuit including: an input end; an output end; a first switch unit connected to the input end and configured to electrically connect the input end to a first node in the case that a positive-phase clock signal is at a first level; a second switch unit connected to the first node and the output end and configured to apply a negative-phase clock signal to the output end in the case that the first node is at the first level; a first capacitor, a first end of which is connected to the first node and a second end of which is connected to the output end; a positive feedback unit connected to the first node and a second node and configured to enable the second node to be at a second level in the case that the first node is at the first level and enable the first node to be at the second level in the case that the second node is at the first level; a third switch unit connected to a third node and configured to enable the third node to be at the first level in the case that the positive-phase clock signal is at the first level; a fourth switch unit connected to the second node and the third node and configured to electrically connect the second node to the third node in the case that the negative-phase clock signal is at the first level; and a fifth switch unit connected to the third node and the output end and configured to enable the output end to be at the second level in the case that the third node is at the first level.

Alternatively, the first switch unit includes a first transistor, a gate electrode of which is connected to an output source of the positive-phase clock signal, one of a source electrode and a drain electrode of which is connected to the input end, and the other one of the source electrode and the drain electrode of which is connected to the first node.

Alternatively, the second switch unit includes a second transistor, a gate electrode of which is connected to the first node, one of a source electrode and a drain electrode of which is connected to the output end, and the other one of the source electrode and the drain electrode of which is connected to an output source of the negative-phase clock signal.

Alternatively, the third switch unit includes a third transistor, a gate electrode of which is connected to the output source of the positive-phase clock signal, one of a source electrode and a drain electrode of which is connected to a first bias voltage line, and the other one of the source electrode and the drain electrode of which is connected to the third node.

Alternatively, the fourth switch unit includes a fourth transistor, a gate electrode of which is connected to the output source of the negative-phase clock signal, one of a source electrode and a drain electrode of which is connected to the third node, and the other one of the source electrode and the drain electrode of which is connected to the second node.

Alternatively, the fifth switch unit includes a fifth transistor, a gate electrode of which is connected to the third node, one of a source electrode and a drain electrode of which is connected to the output end, and the other one of the source electrode and the drain electrode of which is connected to a second bias voltage line.

Alternatively, the positive feedback unit includes a sixth transistor and a seventh transistor. A gate electrode of the sixth transistor is connected to the second node, one of a source electrode and a drain electrode of the sixth transistor is connected to the first node, and the other one of the source electrode and the drain electrode of the sixth transistor is connected to the second bias voltage line. A gate electrode of the seventh transistor is connected to the first node, one of a source electrode and a drain electrode of the seventh transistor is connected to the second node, and the other one of the source electrode and the drain electrode of the seventh transistor is connected to the second bias voltage line.

Alternatively, the first transistor, the second transistor, the third transistor, the fourth transistor, the fifth transistor, the sixth transistor and the seventh transistor are all P-type or N-type transistors.

In another aspect, the present disclosure provides in some embodiments a method for driving the above-mentioned shift register circuit, including steps of: at a first stage where a positive-phase clock signal is at a first level, changing a level at an input end from a second level to a first level, so as to enable, by a first switch unit, a first node to be at the first level, enable, by a positive feedback unit, a second node to be at the second level, enable, by a third switch unit, a third node to be at the first level, and enable, by a fifth switch unit, an output end to be at the second level; at a second stage which follows the first stage and where the positive-phase clock signal is changed to be at the second level, changing the level at the input end from the first level to the second level, so as to enable, by a fourth switch unit, the third node to be at the second level and enable, by a second switch unit, the output end to be at the first level; and at a third stage which follows the second stage and where the positive-phase clock signal is changed to be at the first level, maintaining the second level at the input end, so as to enable, by the first switch unit, the first node to be at the second level, enable, by the third switch unit, the third node to be at the first level, and enable, by the fifth switch unit, the output end to be at the second level.

In yet another aspect, the present disclosure provides in some embodiments an array substrate including a scanning driver circuit having multiple levels of shift register units, and each shift register unit includes the above-mentioned shift register circuit.

Alternatively, apart from a first-level shift register unit, an input end of a current-level shift register unit is connected to an output end of a previous-level shift register unit, and apart from the first-level shift register unit, an output end of a current-level shift register unit is connected to a resetting end of a previous-level shift register unit.

In still yet another aspect, the present disclosure provides in some embodiments a display device including the above-mentioned array substrate.

According to the embodiments of the present disclosure, through the positive feedback unit, it is able to rapidly reset the first node and the second node in a mutual manner. For example, in the case that the level at the first node is being changed from the second level to the first level, the level at the second node may be changed toward the second level at the same time and the change of the level at the second node may accelerate a change speed of the level at the first node toward the first level, and vice versa. As compared with the related art where the response speed of the shift register circuit is adversely affected due to the use of a signal from the output end as a feedback to trigger a pull-up or pull-down action, it is able for the positive feedback unit to trigger the pull-up or pull-down action instead of being triggered by the use of a signal from the output end as a feedback, so as to reduce the response time and increase the response speed to the great extent, thereby to reduce or eliminate additional power consumption caused by a direct current path temporally formed within the response time.

According to the shift register circuit in the embodiments of the present disclosure, the positive feedback unit is used to accelerate charging and discharging speeds of the internal nodes. As compared with the conventional shift register circuit, it is able to reduce the power consumption, increase the response speed and reduce the production cost.

DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION

As required, detailed embodiments are disclosed herein. However, it is to be understood that the disclosed embodiments are merely exemplary and that various and alternative forms may be employed. The figures are not necessarily to scale. Some features may be exaggerated or minimized to show details of particular components. Therefore, specific structural and functional details disclosed herein are not to be interpreted as limiting, but merely as a representative basis for teaching one skilled in the art.

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

Figure 1:
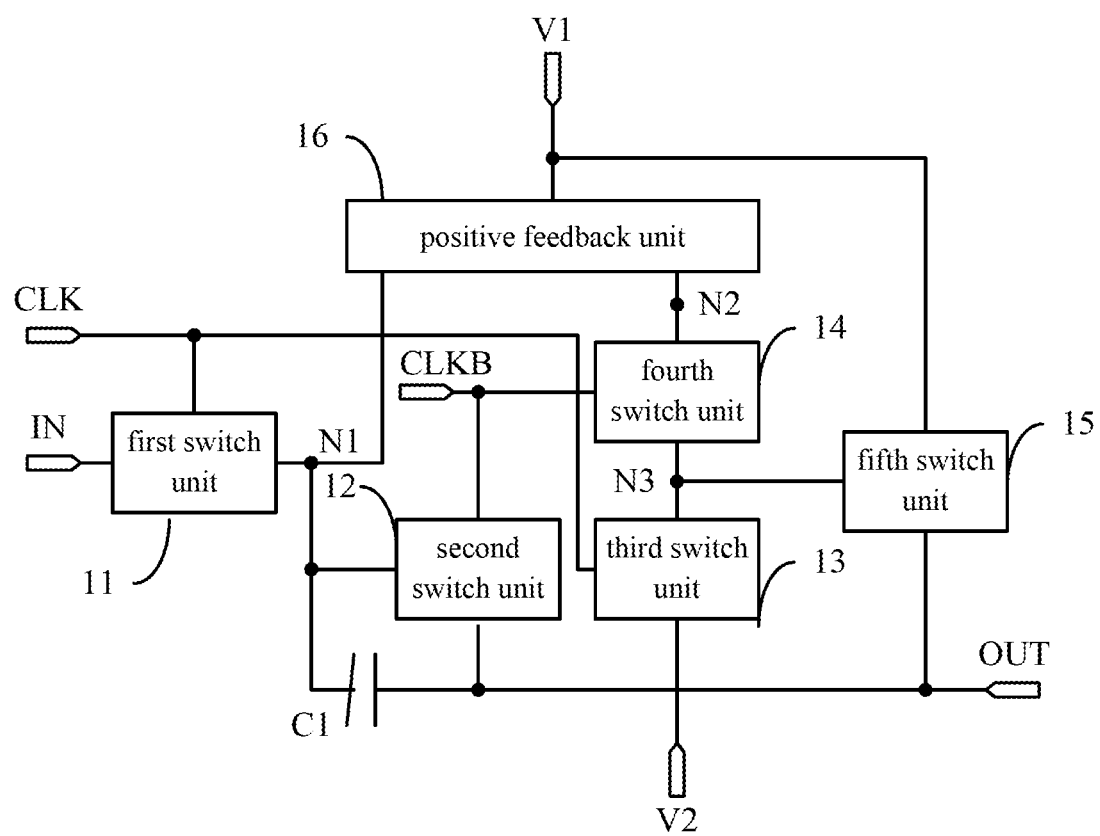
FIG. 1 is a block diagram of a shift register circuit according to one embodiment of the present disclosure.

Referring to FIG. 1, which is a block diagram of a shift register circuit according to one embodiment of the present disclosure, the shift register circuit includes: an input end IN; an output end OUT; a first switch unit 11 connected to the input end IN and configured to electrically connect the input end IN to a first node N1 in the case that a positive-phase clock signal CLK is at a first level; a second switch unit 12 connected to the first node N1 and the output end OUT and configured to apply a negative-phase clock signal CLKB to the output end OUT in the case that the first node N1 is at the first level; a first capacitor C1, a first end of which is connected to the first node N1 and a second end of which is connected to the output end OUT; a third switch unit 13 connected to a third node N3 and configured to enable the third node N3 to be at the first level in the case that the positive-phase clock signal CLK is at the first level; a fourth switch unit 14 connected to a second node N2 and the third node N3 and configured to electrically connect the second node N2 to the third node N3 in the case that the negative-phase clock signal CLKB is at the first level; a fifth switch unit 15 connected to the third node N3 and the output end OUT and configured to enable the output end OUT to be at the second level in the case that the third node N3 is at the first level; and a positive feedback unit 16 connected to the first node N1 and the second node N2 and configured to enable the second node N2 to be at a second level in the case that the first node N1 is at the first level and enable the first node N1 to be at the second level in the case that the second node N2 is at the first level.

It should be appreciated that, the terms "first level" and "second level" refer to "high level" and "low level" respectively, and they represent two logic states, i.e., two potential ranges, at a certain circuit node. For example, a high level at the first node N1 may be a potential 6V larger than a common voltage and a low level at the first node N1 may be a potential 6V smaller than the common voltage, and a high level at the second node N2 may be a potential 3V larger than the common voltage and a low level at the second node N2 may be a potential 3V smaller than the common voltage. It should be further appreciated that, the potential range may be set in accordance with the practical need. The present disclosure is not limited to the above examples. In addition, for example, the first level may be applied via a bias voltage line V2 to which the first level is applied, and the second level may be applied via a bias voltage line V1 to which the second level is applied. The present disclosure is not limited to the above examples.

Figure 2:
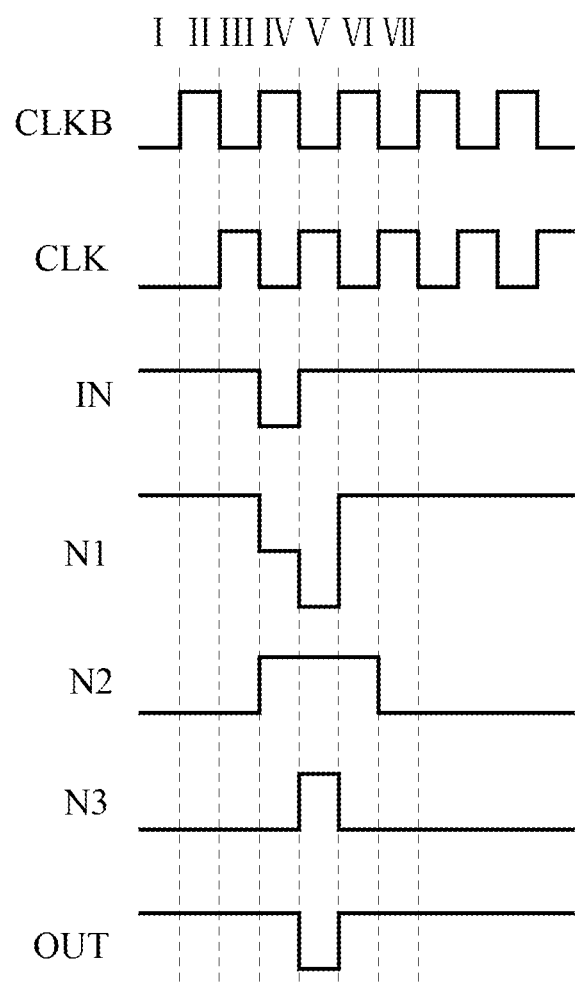
FIG. 2 is a sequence diagram of the shift register circuit in FIG. 1.

FIG. 2 is a sequence diagram of the shift register circuit in FIG. 1 (where the first level is a low level and the second level is a high level).

At Stage I, the positive-phase clock signal CLK and the negative-phase clock signal CLKB are both at low levels, so as to enable the first switch unit 11, the third switch unit 13 and the fourth switch unit 14 to be in a state of being turned on. At this time, due to the high level at the input end IN, the first node N1 is enabled to be at the high level too, and the second node N2 may not be enabled by the positive feedback unit 16 to be at the high level. In addition, because the third switch unit 13 and the fourth switch unit 14 are in the state of being turned on, the second node N2 and the third node N3 are both enabled to be at the low level. At this time, the first node N1 is enabled to be maintained at the high level through the positive feedback unit 16, and the output end OUT is enabled to be at the high level through the fifth switch unit 15, so the shift register circuit may output a signal at the high level.

At Stage II, the positive-phase clock signal CLK is at the low level, the negative-phase clock signal CLKB is at the high level, and the input end IN is at the high level. At this time, the first switch unit 11 and the third switch unit 13 are in the state of being turned on, so as to maintain the high level at the first node N1 and maintain the third node N3 at the low level. The output end OUT is enabled to be at the high level through the fifth switch unit 15, so the shift register circuit may output a signal at the high level. In addition, the second node N2 is in a floating state so as to be maintained at the low level, and the first node N1 is maintained at the high level through the positive feedback unit 16.

At Stage III, the positive-phase clock signal CLK is at the high level, the negative-phase clock signal CLKB is at the low level, and the input end IN is still at the high level. At this time, the fourth switch unit 14 is in the state of being turned on, so as to electrically connect the second node N2 to the third node N3 and maintain the second node N2 and the third node N3 at the low level. The first node N1 is in the floating state so as to be maintained at the high level. The output end OUT is enabled to be at the high level through the fifth switch unit 15, so the shift register circuit may output a signal at the high level. It should be appreciated that, during a period with any time length before the potential at the input end IN is changed to the low level, the shift register circuit may be in the operating states in Stage II and Stage III periodically in accordance with the potentials of the positive-phase clock signal CLK and the negative-phase clock signal CLKB (i.e., in FIG. 2, a plurality of groups of Stage II and Stage III may be added after Stage I and before Stage IV, so as to maintain the output level being unchanged). It should be further appreciated that, regardless of the potentials of the positive-phase clock signal CLK and the negative-phase clock signal CLKB, the shift register circuit may output the signal at the high level as long as the input end IN is maintained at the high level.

At Stage IV, the positive-phase clock signal CLK is at the low level, the negative-phase clock signal CLKB is at the high level, and the input end IN is changed to be at the low level. At this time, the first switch unit 11 is in the state of being turned on, so as to gradually pull down the potential at the first node N1. During this time period, the positive feedback unit 16 may gradually enhance the effect of pulling up the potential at the second node N2, so as to gradually reduce the effect of pulling up the potential at the first node N1, and thereby to facilitate to rapidly pull down the potential at the first node N1 to be at the low level identical to that at the input end IN. As a result, the second switch unit 12 and the third switch unit 13 are in the state of being turned on, so as to maintain the third node N3 at the low level, and thereby maintain the fifth switch unit 15 in the state of being turned on. Because the high level at the negative-phase clock signal CLKB may be applied to the output end OUT, the shift register circuit continues to output a signal at the high level. The fourth switch unit 14 is not in the state of being turned on, so the high level at the second node N2 and the low level at the third node N3 may not influence each other, and no direct current path may be formed from the low level to the high level. In addition, for the first capacitor C1, its first end connected to the first node N1 is enabled to be at the low level, and its second end connected to the output end OUT is maintained at the high level, so the first capacitor C1 is charged at this stage.

At Stage V, the positive-phase clock signal CLK is at the high level, the negative-phase clock signal CLKB is at the low level, and the input end IN is changed to be at the high level. At this time, the first node N1 is in the floating state and maintained at the low level, so the second node N2 may be maintained at the high level through the positive feedback unit 16. The fourth switch unit 14 is in the state of being turned on, so the third node N3 is enabled to be at the high level under the effect of the high level at the second node N2, and the fifth switch unit 15 is no longer in the state of being turned on so as to stop pulling up the potential at the output end OUT. In addition, the second switch unit 12 is in the state of being turned on under the effect of the low level at the first node N1, so the output end OUT may be gradually changed to be at the low level due to the negative-phase clock signal CLKB at the low level. During this time period, the potential at the first node N1 may be further pulled down by the first capacitor C1 for storing charges therein. In the case that the second switch unit 12 includes such a semiconductor element as transistor, a pull-down effect on the potential at the output end OUT may be enhanced due to its characteristics. It should be appreciated that, in the stage V, the fifth switch unit 15 is turned off so as to prevent the generation of a current due to the existence of the high level and the negative-phase clock signal CLKB at the low level, i.e., no direct current path may be formed at Stage V.

At Stage VI, the positive-phase clock signal CLK is at the low level, the negative-phase clock signal CLKB is at the high level, and the input end IN is maintained at the high level. At this time, the first switch unit 11 and the third switch unit 13 are in the state of being turned on, so as to enable the first node N1 to be at the high level and enable the third node N3 to be at the low level. Hence, the second node N2 is in the floating state so as to be maintained at the high level, and the fifth switch unit 15 is in the state of being turned on so as to enable the output end OUT to be at the high level. At this time, the fourth switch unit 14 is not in the state of being turned on, so the high level at the second node N2 and the low level at the third node N3 may not influence each other, and like that in Stage IV, no direct current path may be formed from the high level to the low level.

Finally, at Stage VII, the positive-phase clock signal CLK is at the high level, the negative-phase clock signal CLKB is at the low level, and the input end IN is maintained at the high level. At this time, the fourth switch unit 14 is in the state of being turned on, so as to electrically connect the second node N2 to the third node N3, thereby to enable the potentials at the second node N2 and the third node N3 to be neutralized to an intermediate value in the case that the third switch unit 13 is not in the state of being turned on. As a result, in the case that the second node N2 and the third node N3 are both at the low level (the potential of the intermediate value is sufficient to enable the fifth switch unit to be in the state of being turned on) after the neutralization, the shift register circuit may be switched between the operating states in Stage II and Stage III periodically, as shown in FIG. 2. In the case that the second node N2 and the third node N3 are both at the high level (the potential of the intermediate value is insufficient to enable the fifth switch unit to be in the state of being turned on) after the neutralization, the fifth switch unit 15 may be in a state of being turned off at Stage VII. A result of the neutralization depends on predetermined ranges of the high level and low level at the second node N2 as well as a value of the low level at the third node N3. However, after this, each time the positive-phase clock signal CLK is at the low level, the third node N3 may be pulled down to be at the low level, so the potential at the second node N2 may be pulled down to some extent each time the negative-phase clock signal CLKB is at the low level. Hence, regardless of the arrangement modes, the second node N2 may be pulled down to be at the low level after the elapse of at least one clock cycle. After the second node N2 is pulled down to be at the low level, the positive feedback unit 16 may facilitate to maintain the first node N1 at the high level, so as to ensure the normal operation of the shift register circuit. In order to stabilize the signal outputted by the shift register circuit, potentials at the bias voltage lines at the high and low levels and an on-state voltage of the fifth switch unit 15 may be set appropriately, so as to enable the fifth switch unit 15 to be always in the state of being turned on at and after Stage VII, thereby to ensure the high level at the output end.

It should be appreciated that, the first to fifth switch units in the embodiments of the present disclosure may be implemented by switch elements (e.g., transistors or Hall elements) in the related art, or switch circuits having corresponding functions in the related art.

According to the embodiments of the present disclosure, through the positive feedback unit, it is able to rapidly reset the first node and the second node in a mutual manner. For example, in the case that the level at the first node is being changed from the second level to the first level, the level at the second node may be changed toward the second level at the same time and the change of the level at the second node may accelerate a change speed of the level at the first node toward the first level, and vice versa. As compared with the related art where the response speed of the shift register circuit is adversely affected due to the use of a signal from the output end as a feedback to trigger a pull-up or pull-down action, it is able for the positive feedback unit to trigger the pull-up or pull-down action instead of being triggered by the use of a signal from the output end as a feedback, so as to reduce the response time and increase the response speed to the great extent, thereby to reduce or eliminate additional power consumption caused by a direct current path temporally formed within the response time. In addition, the shift register circuit in the embodiments of the present disclosure is of a relatively simple structure, and no direct current path may be formed during the operation, so it is able to reduce the power consumption. In a word, the positive feedback unit is used to accelerate charging and discharging speeds of the internal nodes of the shift register circuit. As compared with the shift register circuit in the related art, it is able to reduce the power consumption, increase the response speed and reduce the production cost.

Figure 3:
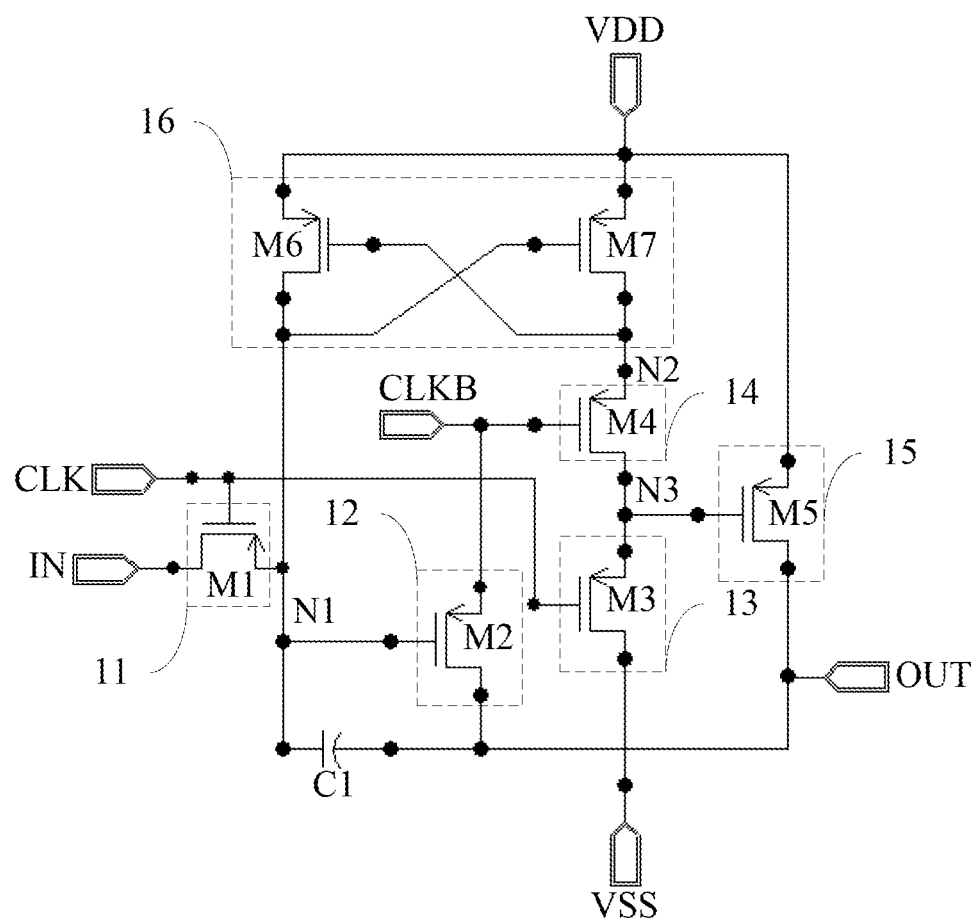
FIG. 3 is a circuit diagram of the shift register circuit according to one embodiment of the present disclosure.

Referring to FIG. 3, which is a circuit diagram of the shift register circuit according to one embodiment of the present disclosure, the first switch unit 11 includes a first transistor M1, a gate electrode of which is connected to an output source of the positive-phase clock signal CLK, one of a source electrode and a drain electrode of which is connected to the input end IN, and the other one of the source electrode and the drain electrode of which is connected to the first node N1. In the case that the positive-phase clock signal CLK is at the low level (the first level), the first transistor M1 may be turned on so as to form a current flowing from the input end IN toward the first node N1 or a current flowing from the first node N1 toward the input end IN, i.e., to electrically connect the input end IN and the first node N1. Hence, in the embodiments of the present disclosure, the function of the first switch unit 11 may be implemented by merely one transistor.

The second switch unit 12 includes a second transistor M2, a gate electrode of which is connected to the first node N1, one of a source electrode and a drain electrode of which is connected to the output end OUT, and the other one of the source electrode and the drain electrode of which is connected to an output source of the negative-phase clock signal CLKB. As a result, in the case that the first node N1 is at the low level (the first level), the second transistor M2 may be turned on, so as to form a current flowing from the negative-phase clock signal CLKB toward the output end OUT or a current from the output end OUT toward the negative-phase clock signal CLKB, i.e., to electrically connect the negative-phase clock signal CLKB to the output end OUT. Hence, in the embodiments of the present disclosure, the function of the second switch unit 12 may be implemented by merely one transistor.

The third switch unit 13 includes a third transistor M3, a gate electrode of which is connected to the output source of the positive-phase clock signal CLK, one of a source electrode and a drain electrode of which is connected to a first bias voltage line VSS, and the other one of the source electrode and the drain electrode of which is connected to the third node N3. As a result, in the case that the positive-phase clock signal CLK is at the low level (the first level), the third transistor M3 may be turned on, so as to form a current flowing from the third node N3 toward the first bias voltage line VSS, i.e., to pull down the third node N3 to be at the first level. Hence, in the embodiments of the present disclosure, the function of the third switch unit 13 may be implemented by merely one transistor.

The fourth switch unit 14 includes a fourth transistor M4, a gate electrode of which is connected to the output source of the negative-phase clock signal CLKB, one of a source electrode and a drain electrode of which is connected to the third node N3, and the other one of the source electrode and the drain electrode of which is connected to the second node N2. As a result, in the case that the negative-phase clock signal CLKB is at the low level (the first level), the fourth transistor M4 may be turned on, so as to form a current flowing from the second node N2 toward the third node N3 or a current flowing from the third node N3 toward the second node N2, i.e., to electrically connect the second node N2 to the third node N3. Hence, in the embodiments of the present disclosure, the function of the fourth switch unit 14 may be implemented by merely one transistor.

The fifth switch unit 15 includes a fifth transistor M5, a gate electrode of which is connected to the third node N3, one of a source electrode and a drain electrode of which is connected to the output end OUTPUT, and the other one of the source electrode and the drain electrode of which is connected to a second bias voltage line VDD. As a result, in the case that the third node N3 is at the low level (the first level), the fifth transistor M5 may be turned on, so as to form a current flowing from the second bias voltage line VDD toward the output end OUT, i.e., to pull up the output end OUT to be at the high level (the second level). Hence, in the embodiments of the present disclosure, the function of the fifth switch unit 15 may be implemented by merely one transistor.

The positive feedback unit 16 includes a sixth transistor M6 and a seventh transistor M7. A gate electrode of the sixth transistor M6 is connected to the second node N2, one of a source electrode and a drain electrode of the sixth transistor M6 is connected to the first node N1, and the other one of the source electrode and the drain electrode of the sixth transistor M6 is connected to the second bias voltage line VDD. A gate electrode of the seventh transistor M7 is connected to the first node N1, one of a source electrode and a drain electrode of the seventh transistor M7 is connected to the second node N2, and the other one of the source electrode and the drain electrode of the seventh transistor M7 is connected to the second bias voltage line VDD. As a result, in the case that the first node N1 is at the low level (the first level), the seventh transistor M7 may be turned on, so as to form a current flowing from the second bias voltage line VDD toward the second node N2, thereby to pull up the second node N2 to be at the high level (the second level). In the case that the second node N2 is at the low level, the sixth transistor M6 may be turned on, so as to form a current flowing from the second bias voltage line VDD toward the first node N1, thereby to pull up the first node N1 to be at the high level. In other words, through the sixth transistor M6 and the seventh transistor M7, it is able to pull up the second node N2 to be at the second level in the case that the first node N1 is at the first level, and pull up the first node N1 to be at the second level in the case that the second node N2 is at the first level. Hence, in the embodiments of the present disclosure, the function of the fifth switch unit 15 may be implemented by two transistors.

It should be appreciated that, each transistor in FIG. 3 is a P-type transistor (which is turned on in the case that its gate electrode is at a low level). Of course, in some alternative embodiments, each transistor may be an N-type transistor (which is turned on in the case that its gate electrode is at a low level) alternatively, and at this time, the first level is a high level and the second level is a low level. In addition, the connection modes for the source electrode and drain electrode of each transistor may be determined based on the type of the transistor. For example, the source electrode of the P-type transistor may be connected to an end at the high level, while the drain electrode thereof may be connected to an end at the low level. Especially, in the case that the source electrode and the drain electrode of the transistor are symmetrical, they may be replaced with each other.

Hence, in the positive feedback unit 16, in the case that the first node N1 is at the high level and the second node N2 is at the low level in an initial state, a source-to-drain current generated by the seventh transistor M7 may gradually increase along with a decrease in the potential at the first node N1 within a certain time period, so as to pull up the potential at the second node N2 faster and faster. In contrast, a source-to-drain current generated by the sixth transistor M6 may gradually decrease along with an increase in the potential at the second node N2, so as to pull down the potential at the first node N1. In a word, through the positive feedback unit 16, it is able to rapidly reset the first node and the second node.

It should be appreciated that, the shift register circuit may also operate in accordance with the sequence diagram in FIG. 2, and a detailed explanation thereof is omitted herein. It can be seen, in this shift register circuit, at each stage, no direct current path may be formed between any two of the output source of the positive-phase clock signal CLK, the output source of the negative-phase clock signal CLKB, the first bias voltage line VSS and the second bias voltage line VDD. As a result, no additional direct current power consumption may be generated, so that the power consumption may be reduced.

In addition, the function of the shift register circuit in the embodiments of the present disclosure may be implemented by seven transistors and one capacitor, and as compared with the shift register circuit in the related art, it is able to simplify the structure, reduce the power consumption, increase the response speed and reduce the production cost.

Figure 4:
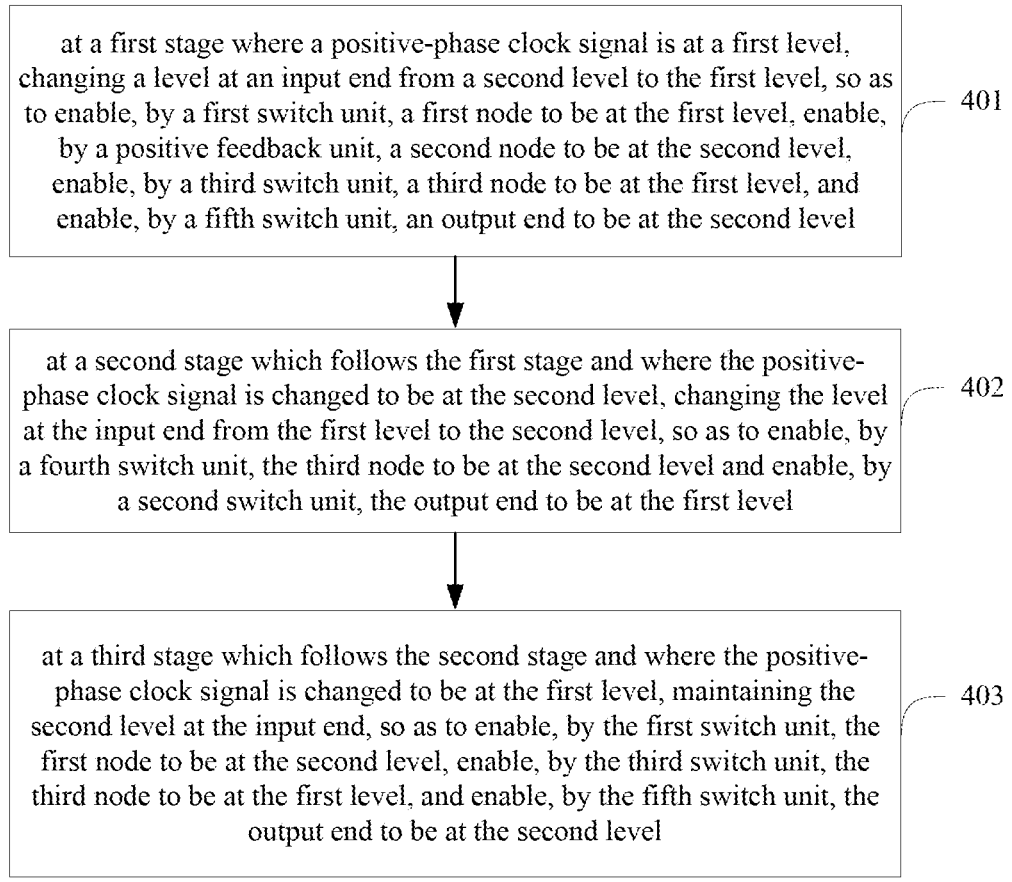
FIG. 4 is a flow chart of a method for driving the shift register circuit according to one embodiment of the present disclosure.

Based on an identical inventive concept, the present disclosure further provides a method for driving any of the above shift register circuits which, as shown in FIG. 4, includes: Step 401 of, at a first stage where the positive-phase clock signal is at the first level, changing a level at the input end from the second level to the first level, so as to enable, by the first switch unit, the first node to be at the first level, enable, by the positive feedback unit, the second node to be at the second level, enable, by the third switch unit, the third node to be at the first level, and enable, by the fifth switch unit, the output end to be at the second level; Step 402 of, at a second stage which follows the first stage and where the positive-phase clock signal is changed to be at the second level, changing the level at the input end from the first level to the second level, so as to enable, by the fourth switch unit, the third node to be at the second level and enable, by the second switch unit, the output end to be at the first level; and Step 403 of, at a third stage which follows the second stage and where the positive-phase clock signal is changed to be at the first level, maintaining the second level at the input end, so as to enable, by the first switch unit, the first node to be at the second level, enable, by the third switch unit, the third node to be at the first level, and enable, by the fifth switch unit, the output end to be at the second level.

It should be appreciated that, the timing sequence as shown in FIG. 2 is merely an example, the first stage in the embodiments of the present disclosure may correspond to Stage IV in FIG. 2, the second stage may correspond to Stage V in FIG. 2, and the third stage may correspond to Stage VI in FIG. 2. In addition, the steps of the method may correspond to the operating sequence of the shift register circuit. In the case that the method is applied to the above shift register circuit, it is able to simplify the structure of the shift register circuit, reduce the power consumption, increase the response speed and reduce the cost.

Based on an identical inventive concept, the present disclosure further provides in some embodiments an array substrate including a scanning driver circuit having multiple levels of shift register units, and each shift register unit includes any one of the above-mentioned shift register circuits. For example, the multi levels of shift register unit may be arranged as follows: apart from a first-level shift register unit, an input end of a current-level shift register unit is connected to an output end of a previous-level shift register unit, and apart from the first-level shift register unit, an output end of a current-level shift register unit is connected to a resetting end of a previous-level shift register unit. It should be appreciated that, the scanning driver circuit may be arranged beyond a display region, so as to form a Gate On Array (GOA) circuit, thereby to simplify the structure, reduce the power consumption, increase the response speed and reduce the production cost.

Based on an identical inventive concept, the present disclosure provides in some embodiments a display device including the above-mentioned array substrate. The display device may be any product or member having a display function, such as a display panel, an electronic paper, a mobile phone, a flat-panel computer, a television, a laptop computer, a digital photo frame or a navigator.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A shift register circuit, comprising:
   an input end;
   an output end;
   a first switch connected to the input end and configured to electrically connect the input end to a first node in the case that a positive-phase clock signal is at a first level;
   a second switch connected to the first node and the output end and configured to apply a negative-phase clock signal to the output end in the case that the first node is at the first level;
   a first capacitor, wherein a first end of the first capacitor is connected to the first node and a second end of the first capacitor is connected to the output end;
   a positive feedback unit connected to the first node and a second node and configured to enable the second node to be at a second level in the case that the first node is at the first level and enable the first node to be at the second level in the case that the second node is at the first level;
   a third switch connected to a third node and configured to enable the third node to be at the first level in the case that the positive-phase clock signal is at the first level;
   a fourth switch connected to the second node and the third node and configured to electrically connect the second node to the third node in the case that the negative-phase clock signal is at the first level; and
   a fifth switch connected to the third node and the output end and configured to enable the output end to be at the second level in the case that the third node is at the first level.

2. The shift register circuit according to claim 1, wherein the first switch comprises a first transistor, wherein a gate electrode of the first transistor is connected to an output source of the positive-phase clock signal, one of a source electrode and a drain electrode of the first transistor is connected to the input end, and the other one of the source electrode and the drain electrode of the first transistor is connected to the first node.

3. The shift register circuit according to claim 1, wherein the second switch comprises a second transistor, wherein a gate electrode of the second transistor is connected to the first node, one of a source electrode and a drain electrode of the second transistor is connected to the output end, and the other one of the source electrode and the drain electrode of the second transistor is connected to an output source of the negative-phase clock signal.

4. The shift register circuit according to claim 1, wherein the third switch comprises a third transistor, wherein a gate electrode of the third transistor is connected to the output source of the positive-phase clock signal, one of a source electrode and a drain electrode of the third transistor is connected to a first bias voltage line, and the other one of the source electrode and the drain electrode of the third transistor is connected to the third node.

5. The shift register circuit according to claim 1, wherein the fourth switch comprises a fourth transistor, wherein a gate electrode of the fourth transistor is connected to the output source of the negative-phase clock signal, one of a source electrode and a drain electrode of the fourth transistor is connected to the third node, and the other one of the source electrode and the drain electrode of the fourth transistor is connected to the second node.

6. The shift register circuit according to claim 1, wherein the fifth switch comprises a fifth transistor, wherein a gate electrode of the fifth transistor is connected to the third node, one of a source electrode and a drain electrode of the fifth transistor is connected to the output end, and the other one of the source electrode and the drain electrode of the fifth transistor is connected to a second bias voltage line.

7. The shift register circuit according to claim 1, wherein the positive feedback unit comprises a sixth transistor and a seventh transistor;
   a gate electrode of the sixth transistor is connected to the second node, one of a source electrode and a drain electrode of the sixth transistor is connected to the first node, and the other one of the source electrode and the drain electrode of the sixth transistor is connected to a second bias voltage line; and
   a gate electrode of the seventh transistor is connected to the first node, one of a source electrode and a drain electrode of the seventh transistor is connected to the second node, and the other one of the source electrode and the drain electrode of the seventh transistor is connected to the second bias voltage line.

8. The shift register circuit according to claim 2, wherein the second switch comprises a second transistor, wherein a gate electrode of the second transistor is connected to the first node, one of a source electrode and a drain electrode of the second transistor is connected to the output end, and the other one of the source electrode and the drain electrode of the second transistor is connected to an output source of the negative-phase clock signal;

the third switch comprises a third transistor, wherein a gate electrode of the third transistor is connected to the output source of the positive-phase clock signal, one of a source electrode and a drain electrode of the third transistor is connected to a first bias voltage line, and the other one of the source electrode and the drain electrode of the third transistor is connected to the third node;

the fourth switch comprises a fourth transistor, wherein a gate electrode of the fourth transistor is connected to the output source of the negative-phase clock signal, one of a source electrode and a drain electrode of the fourth transistor is connected to the third node, and the other one of the source electrode and the drain electrode of the fourth transistor is connected to the second node;

the fifth switch comprises a fifth transistor, wherein a gate electrode of the fifth transistor is connected to the third node, one of a source electrode and a drain electrode of the fifth transistor is connected to the output end, and the other one of the source electrode and the drain electrode of the fifth transistor is connected to a second bias voltage line; and the positive feedback unit comprises a sixth transistor and a seventh transistor, wherein a gate electrode of the sixth transistor is connected to the second node, one of a source electrode and a drain electrode of the sixth transistor is connected to the first node, the other one of the source electrode and the drain electrode of the sixth transistor is connected to the second bias voltage line, a gate electrode of the seventh transistor is connected to the first node, one of a source electrode and a drain electrode of the seventh transistor is connected to the second node, and the other one of the source electrode and the drain electrode of the seventh transistor is connected to the second bias voltage line.

9. The shift register circuit according to claim 8, wherein all of the first transistor, the second transistor, the third transistor, the fourth transistor, the fifth transistor, the sixth transistor and the seventh transistor are P-type or all of the first transistor, the second transistor, the third transistor, the fourth transistor, the fifth transistor, the sixth transistor and the seventh transistor are N-type transistors.

10. An array substrate, comprising a scanning driver circuit having multiple levels of shift register stages, wherein each of the shift register stages comprises the shift register circuit according to claim 1.

11. The array substrate according to claim 10, wherein the first switch comprises a first transistor, wherein a gate electrode of the first transistor is connected to an output source of the positive-phase clock signal, one of a source electrode and a drain electrode of the first transistor is connected to the input end, and the other one of the source electrode and the drain electrode of the first transistor is connected to the first node.

12. The array substrate according to claim 10, wherein the second switch comprises a second transistor, wherein a gate electrode of the second transistor is connected to the first node, one of a source electrode and a drain electrode of the second transistor is connected to the output end, and the other one of the source electrode and the drain electrode of the second transistor is connected to an output source of the negative-phase clock signal.

13. The array substrate according to claim 10, wherein the third switch comprises a third transistor, wherein a gate electrode of the third transistor is connected to the output source of the positive-phase clock signal, one of a source electrode and a drain electrode of the third transistor is connected to a first bias voltage line, and the other one of the source electrode and the drain electrode of the third transistor is connected to the third node.

14. The array substrate according to claim 10, wherein the fourth switch comprises a fourth transistor, wherein a gate electrode of the fourth transistor is connected to the output source of the negative-phase clock signal, one of a source electrode and a drain electrode of the fourth transistor is connected to the third node, and the other one of the source electrode and the drain electrode of the fourth transistor is connected to the second node.

15. The array substrate according to claim 10, wherein the fifth switch comprises a fifth transistor, wherein a gate electrode of the fifth transistor is connected to the third node, one of a source electrode and a drain electrode of the fifth transistor is connected to the output end, and the other one of the source electrode and the drain electrode of the fifth transistor is connected to a second bias voltage line.

16. The array substrate according to claim 10, wherein the positive feedback unit comprises a sixth transistor and a seventh transistor;

a gate electrode of the sixth transistor is connected to the second node, one of a source electrode and a drain electrode of the sixth transistor is connected to the first node, and the other one of the source electrode and the drain electrode of the sixth transistor is connected to the second bias voltage line; and a gate electrode of the seventh transistor is connected to the first node, one of a source electrode and a drain electrode of the seventh transistor is connected to the second node, and the other one of the source electrode and the drain electrode of the seventh transistor is connected to the second bias voltage line.

17. The array substrate according to claim 10, wherein an input end of a current-level shift register stage is connected to an output end of a previous-level shift register stage; and an output end of a current-level shift register stage is connected to a resetting end of a previous-level shift register stage.

18. A display device, comprising the array substrate according to claim 10.

19. The display device according to claim 18, wherein the first switch includes a first transistor, wherein a gate electrode of the first transistor is connected to an output source of the positive-phase clock signal, one of a source electrode and a drain electrode of the first transistor is connected to the input end, and the other one of the source electrode and the drain electrode of the first transistor is connected to the first node.

20. A method for driving a shift register circuit, including an input end, an output end, a first switch connected to the input end and configured to electrically connect the input end to a first node in the case that a positive-phase clock signal is at a first level, a second switch connected to the first node and the output end and configured to apply a negative-phase clock signal to the output end in the case that the first node is at the first level, a first capacitor, wherein a first end of the first capacitor is connected to the first node and a second end of the first capacitor is connected to the output end, a positive feedback unit connected to the first node and a second node and configured to enable the second node to be at a second level in the case that the first node is at the first level and enable the first node to be at the second level in the case that the second node is at the first level, a third switch connected to a third node and configured to enable the third node to be at the first level in the case that the positive-phase clock signal is at the first level, a fourth switch connected to the second node and the third node and configured to electrically connect the second node to the third node in the case that the negative-phase clock signal is at the first level, and a fifth switch connected to the third node and the output end and configured to enable the output end to be at the second level in the case that the third node is at the first level, the method comprising:

at a first stage where the positive-phase clock signal is at the first level, changing a level at the input end from the second level to the first level, so as to enable, by the first switch, the first node to be at the first level, enable, by the positive feedback unit, the second node to be at the second level, enable, by the third switch, the third node to be at the first level, and enable, by the fifth switch, the output end to be at the second level;

at a second stage which follows the first stage and where the positive-phase clock signal is changed to be at the second level, changing the level at the input end from the first level to the second level, so as to enable, by the fourth switch, the third node to be at the second level and enable, by the second switch, the output end to be at the first level; and at the third stage which follows the second stage and where the positive-phase clock signal is changed to be at the first level, maintaining the second level at the input end, so as to enable, by the first switch, the first node to be at the second level, enable, by the third switch, the third node to be at the first level, and enable, by the fifth switch, the output end to be at the second level.

* * * * *